United States Patent [19]

Smith et al.

[11] Patent Number: 5,122,745
[45] Date of Patent: Jun. 16, 1992

[54] METHOD AND APPARATUS FOR DETERMINING MOLECULAR DYNAMICS OF MATERIALS

[75] Inventors: Patrick B. Smith; David J. Moll, both of Midland, Mich.

[73] Assignee: The Dow Chemical Company, Midland, Mich.

[21] Appl. No.: 386,506

[22] Filed: Jul. 28, 1989

[51] Int. Cl.$^5$ .............................................. G01R 33/20
[52] U.S. Cl. ...................................... 324/307; 324/300
[58] Field of Search ............... 324/300, 307, 318, 321; 422/102, 103; 436/173; 73/38, 153

[56] References Cited

U.S. PATENT DOCUMENTS

| | | | |
|---|---|---|---|
| 4,155,248 | 5/1979 | Wagner et al. | 73/38 |
| 4,627,270 | 12/1986 | Jones | 73/38 |
| 4,769,602 | 9/1988 | Vinegar et al. | 324/307 |

OTHER PUBLICATIONS

R. R. Hewitt et al., "Nuclear Quadrupole Resonance . . . Polymers", J. Applied Physics, vol. 43, No. 8, Aug. 1972, pp. 3386–3392.

Primary Examiner—Michael J. Tokar

[57] ABSTRACT

A method and apparatus for determining the effects of pressure and/or dissoved gas on the molecular dynamics in solids, such as glassy polymers, or gases sorbed by the solids, involves the use of nuclear magnetic resonance (NMR) spectroscopy wherein a pressure resistant sample cell is combined with an NMR probe which in turn is subjected to a magnetic field, a diffusion gas being injected into the sample cell under varying pressure with resultant NMR spectra being collected and correlated.

19 Claims, 10 Drawing Sheets

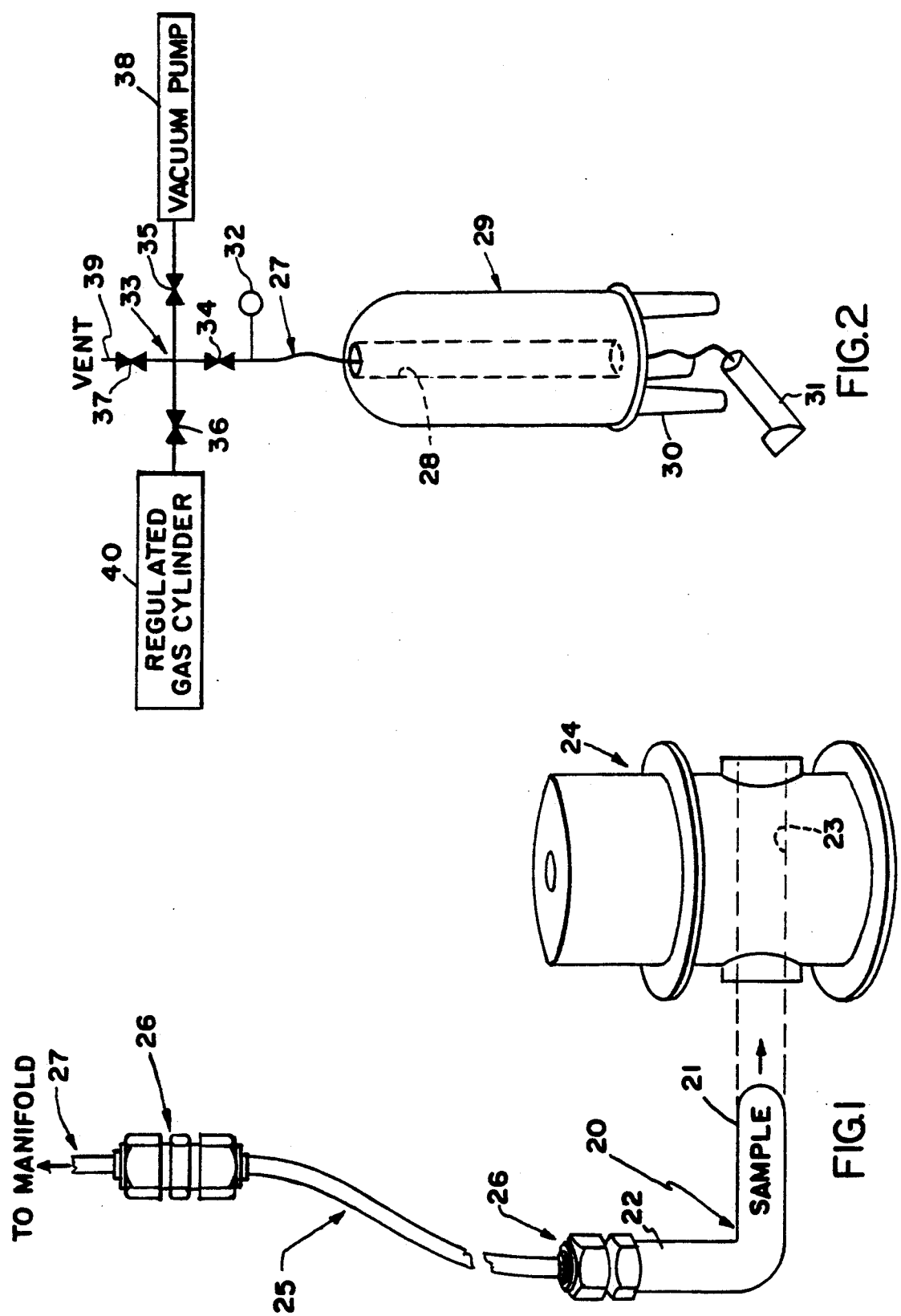

METHOD AND APPARATUS FOR DETERMINING MOLECULAR DYNAMICS OF MATERIALS

The present invention is directed to nuclear magnetic resonance (NMR) spectroscopy methods and apparatus for determining the effects of external gas pressure and/or sorbed gas on the molecular dynamics of solid materials.

BACKGROUND OF THE INVENTION

Polymeric materials are widely used as membranes for the separation of gases and liquids and as barriers in packaging. In general, the fundamental molecular level mechanisms of transport have only been inferred from bulk transport measurements, i.e., permeation and diffusivity studies.

Chain dynamics play a crucial yet poorly understood role in the diffusional transport of small molecules through polymers. If the frequencies, amplitudes, and average separations of polymer chains were precisely known, a detailed molecular model of diffusional transport could be developed.

Various theories have been proposed to model transport processes in glassy polymers, the most notable being the so-called "dual mode" theory which describes transport and sorption of gases by polymeric systems in terms of two types of sites or modes. These sites are described as Henry's law sites (dissolution sites) and Langmuir sites (hole filling sites).

According to simple dual mode theory, the two sites have different diffusion coefficients which are independent of pressure. Both sites are assumed to have different binding strengths for gas molecules. Therefore, gas molecules in the two sites would have different mobilities, it being assumed that Henry (dissolution) sites would have less restricted mobility than the Langmuir (hole filling) sites.

The dual mode theory adequately describes the pressure dependence of such parameters as the solubility constant and permeability of a gas in glassy polymers, both of which are known to decrease with pressure for most glassy polymeric systems. However, the dual mode theory describes transport as a macroscopic phenomenon, neglecting the molecular properties or dynamics of the polymeric membrane.

One approach to the determination of molecular dynamics of a polymer involves the use of "magic angle spinning" (MAS) $^{13}C$ NMR spectroscopy. This probing of microscopic molecular dynamics, as distinguished from the study of the macroscopic phenomenon described, requires spinning a sample cell at 1000 to 5000 Hz which imposes certain constraints on the procedure. For example, the cells must be well balanced, dimensionally stable, and cannot be connected to any external condition-establishing source, such as a pressure source. Therefore, in order to change the pressure in the cell, the procedure must be discontinued and the cell removed from the spectrometer. Maximum pressures safely achieved with this technique are under 5 atmospheres, well outside the range of interest for membrane applications.

SUMMARY OF THE INVENTION

The invention comprises a method and apparatus useful in determining microscopic molecular dynamics in materials, such as polymers, by means of NMR spectroscopy of samples of such materials subjected to variable pressures. The method and apparatus are useful in the determination of the effects of pressure and/or dissolved gases on the molecular dynamics of polymeric materials, the apparatus including a sample cell forming a part of an evacuation and pressurization system suitable for use in an NMR probe, thereby permitting analysis of the effects of external gas pressure and/or dissolved gas on the molecular dynamics and structure by wide line solid state NMR spectroscopy. The method is also useful for probing the molecular dynamics of the pressure-inducing gas molecules under pressure conditions.

The invention includes the step of introducing a diffusion gas, the molecules of which have NMR active nuclei, into the NMR sample cell under varying pressure and collecting and correlating resultant NMR spectra. Thus, much higher gas pressure may be relied upon than is permissible with MAS techniques. Continuous variable pressure operation is available utilizing an uncomplicated, easily operated pressure control system. The handling of pressurized samples is avoided, thus improving the overall safety of the procedure. Variable temperature operation is readily available and excellent definitions of dynamic and structural characteristics of polymer molecules are obtained.

THE DRAWINGS

FIG. 1 is a diagrammatic illustration of a portion of apparatus according to the invention and suitable for use in variable pressure operation of an NMR spectrometer;

FIG. 2 is a diagrammatic illustration of the entire apparatus of the invention on a reduced scale;

Figure 4:
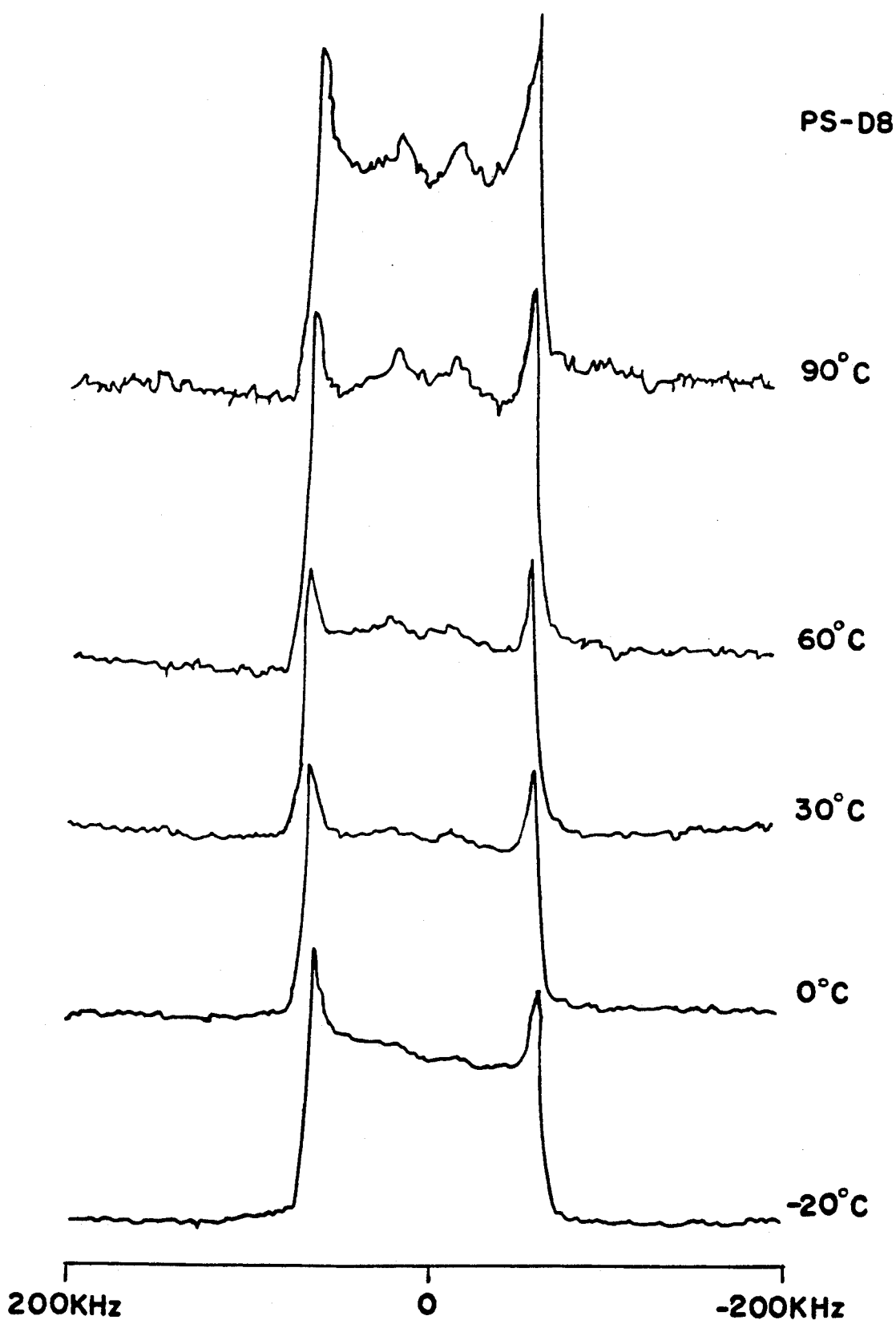
Figure 5:
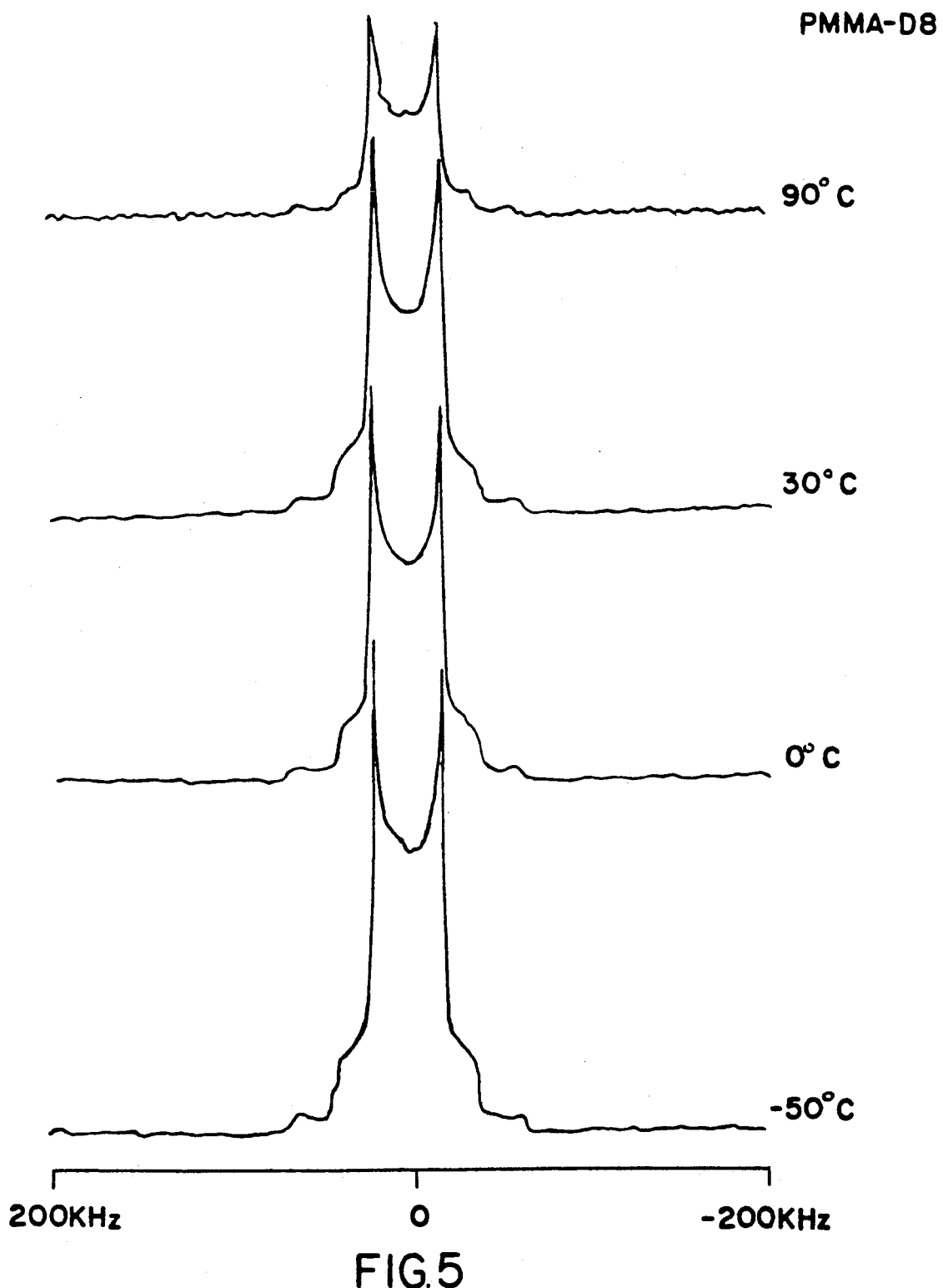
Figure 6:
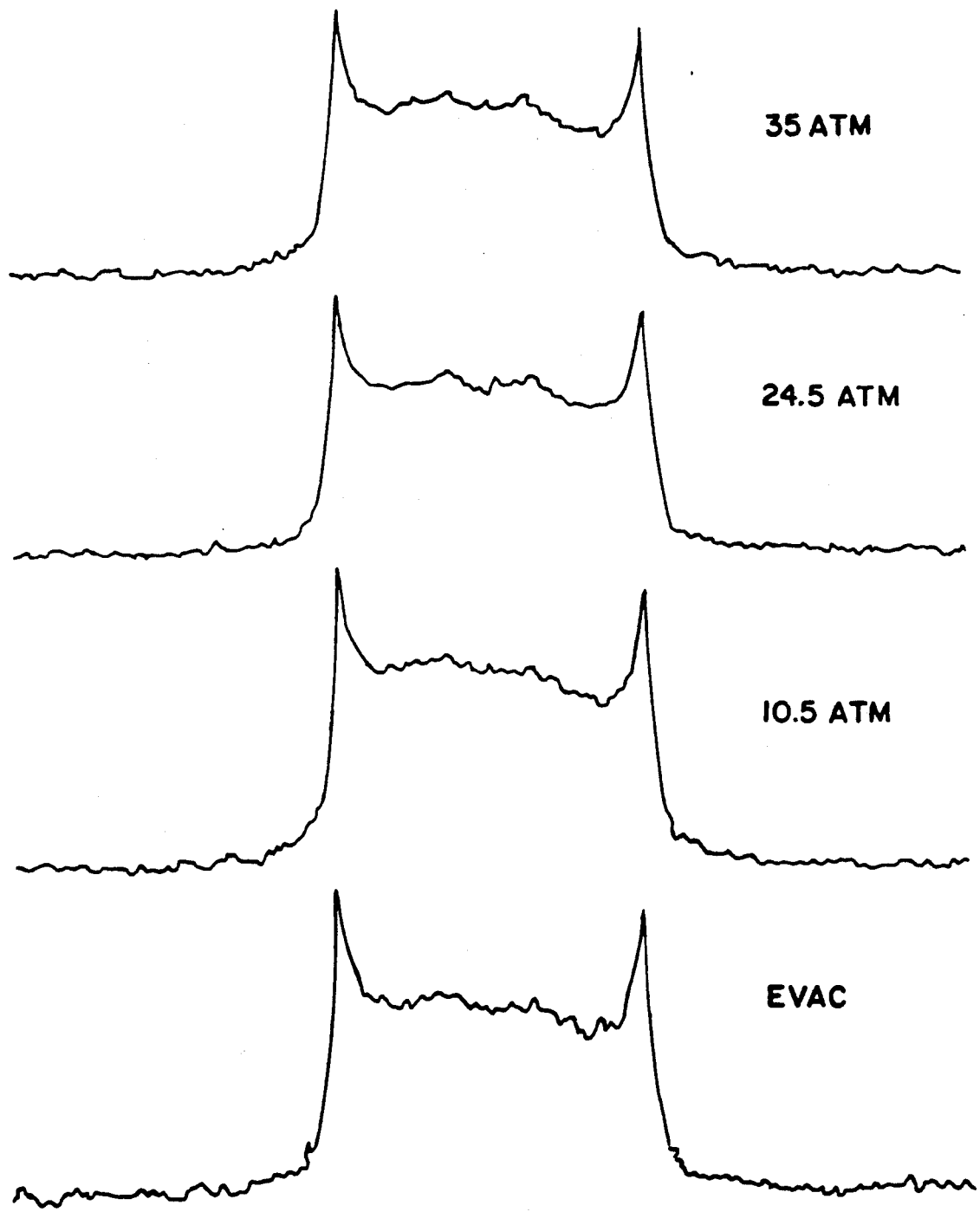
Figure 7:
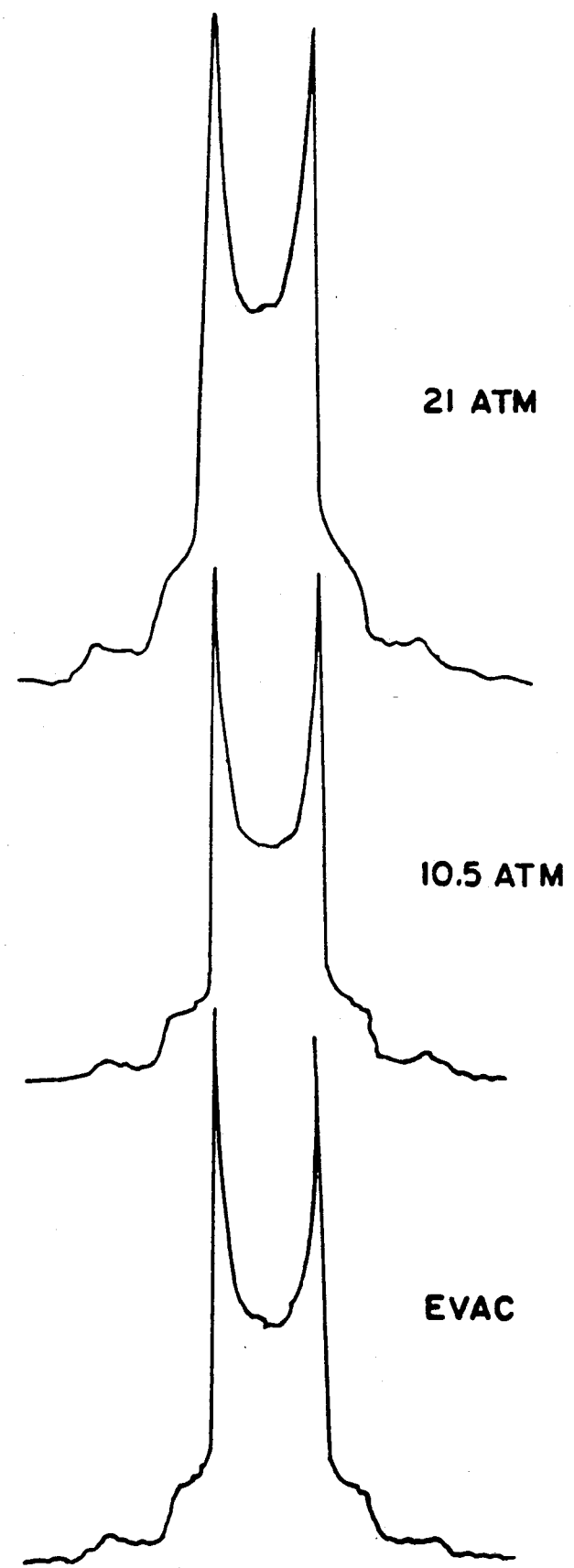
Figure 8:
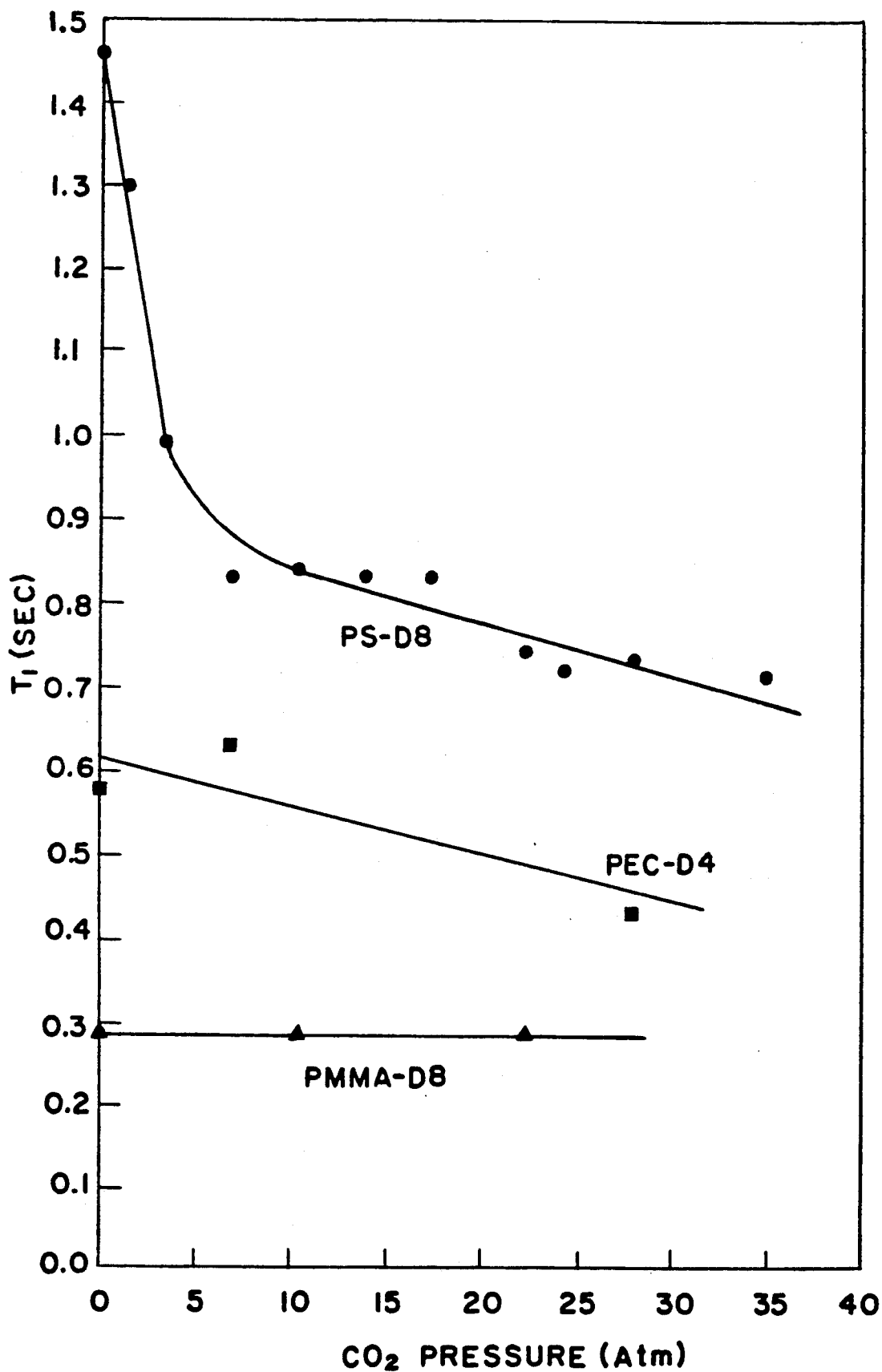
Figure 9:
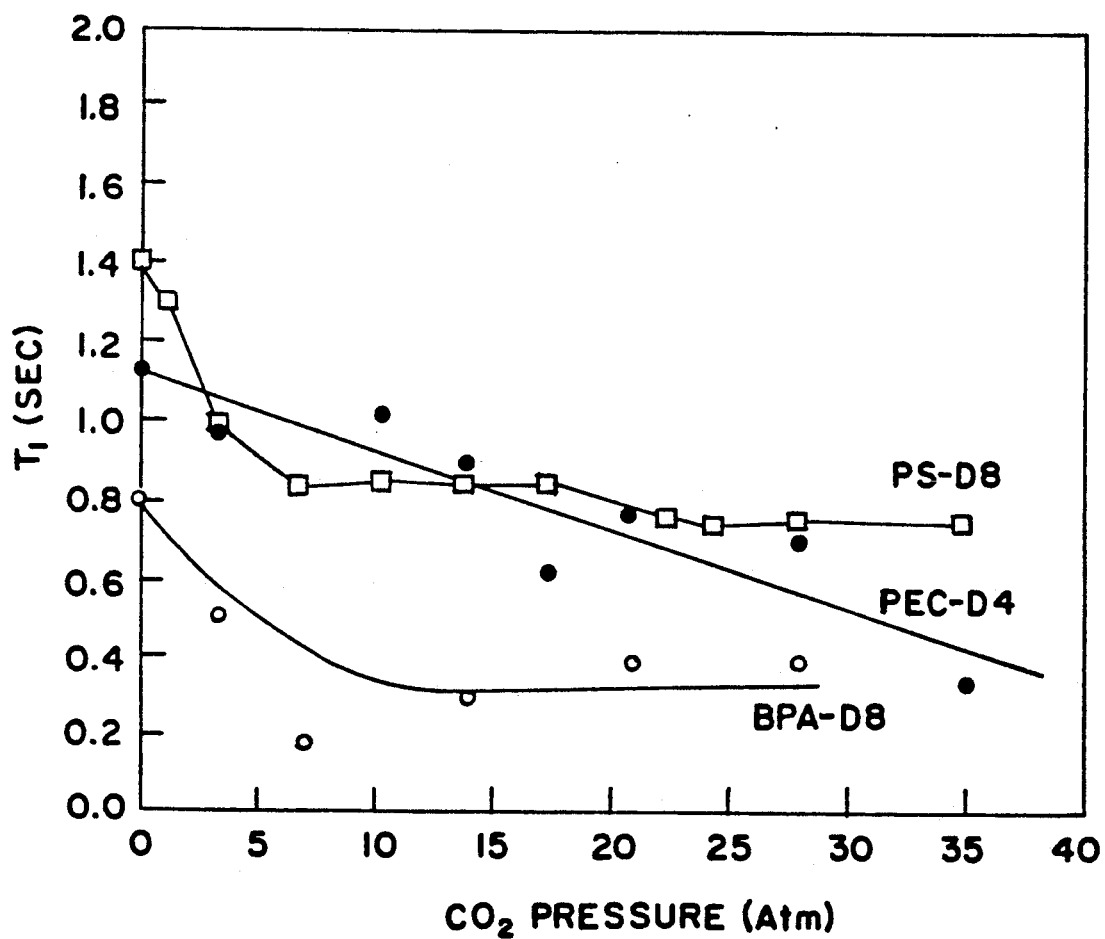
Figure 10:
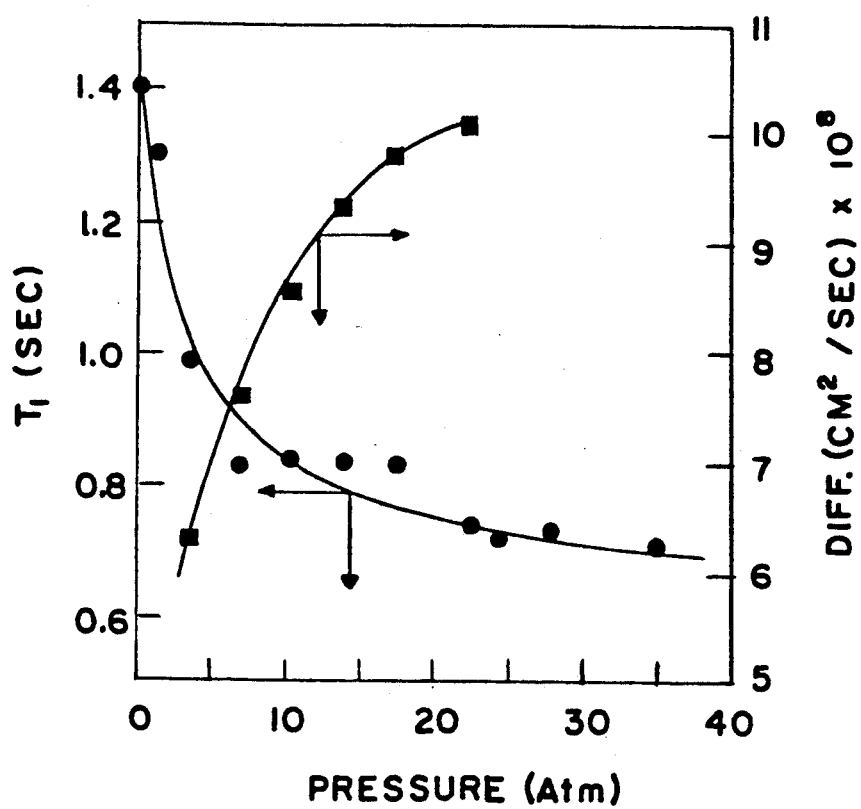
Figure 11:
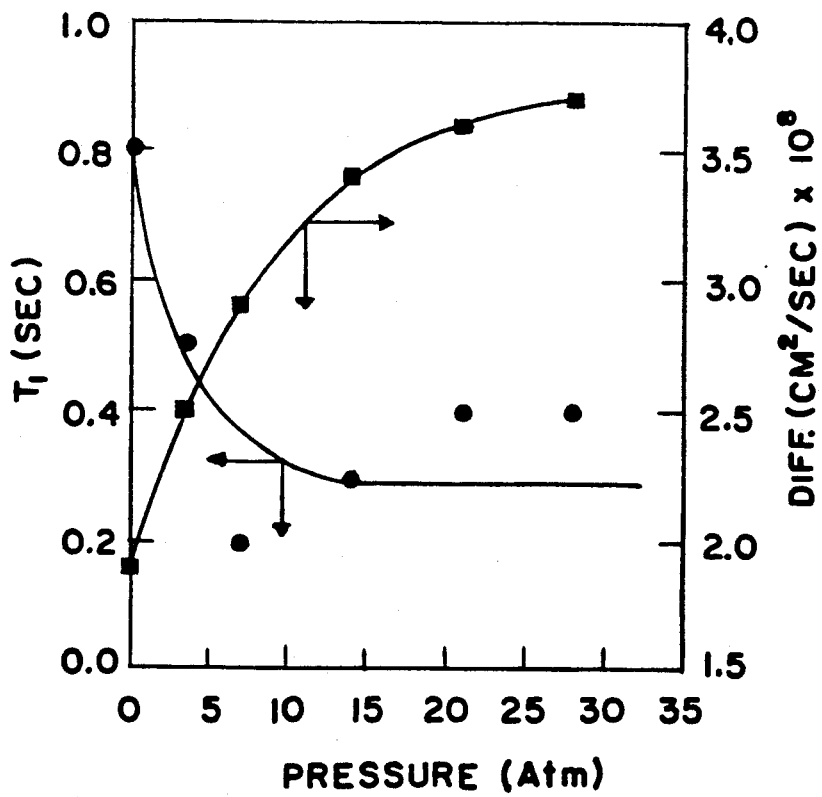
Figure 12:
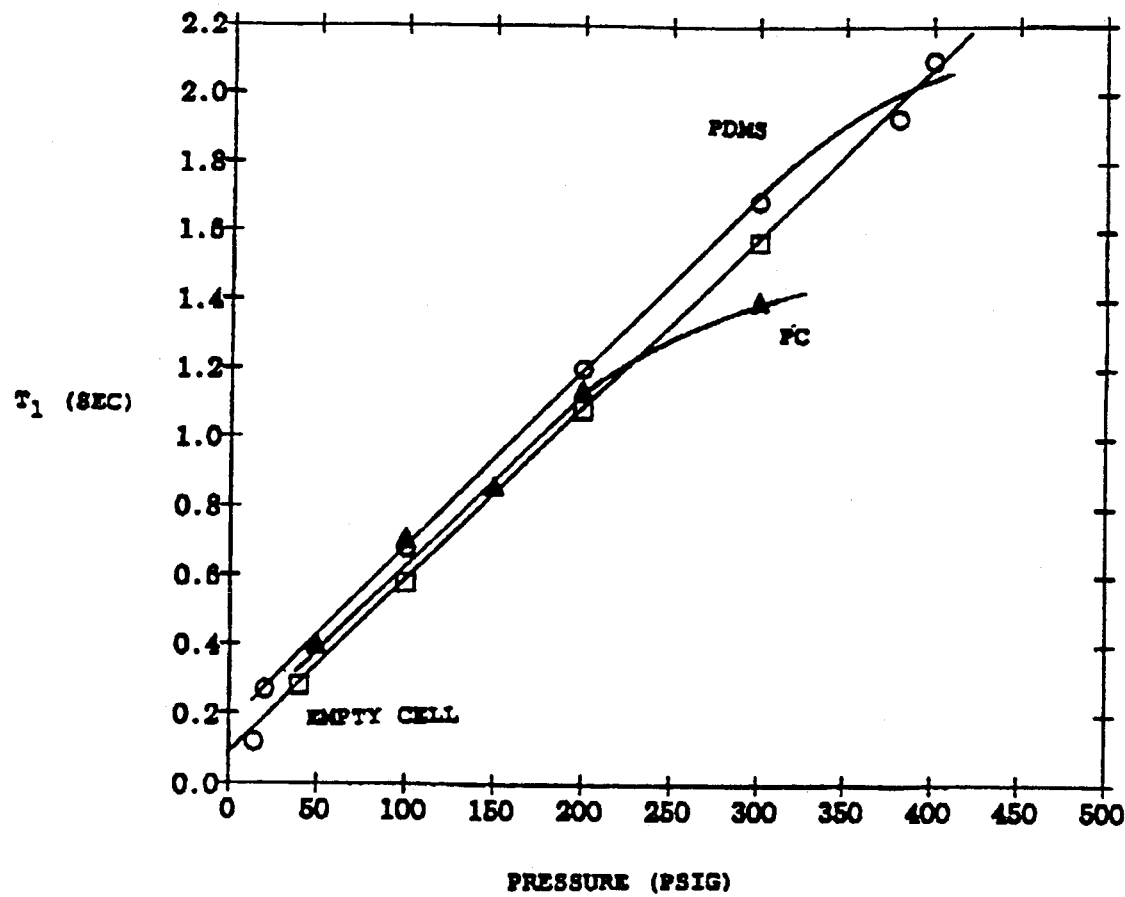

FIG. 4 discloses a series of line shapes of one polymer (PS-D8) recorded at varying temperatures;

FIG. 5 discloses a series of line shapes of another polymer (PMMA-D8) recorded at varying temperatures;

FIG. 6 discloses a series of line shapes of the polymer PS-D8 recorded at varying pressures;

FIG. 7 discloses a series of line shapes of the polymer PMMA-D8 recorded at varying pressures;

FIG. 8 is a graph comparing $^2H$ NMR spin lattice relaxation times with varying pressure conditions for selected polymers at the same temperature;

FIG. 9 is a graph similar to FIG. 8 comparing $^2H$ NMR spin lattice relaxation times diffusion gas transport rates of various polymers under varying pressure conditions and at different temperatures;

FIG. 10 is a graph illustrating the correlation between pressure dependence of diffusion gas diffusivity and NMR transport rate values for polystyrene;

FIG. 11 is a graph similar to FIG. 10 illustrating the correlated values for a different bisphenol—A polycarbonate; and FIG. 12 is a graph showing the dependence of $^2H$ NMR spin lattice relaxation time ($T_1$) of $CD_4$ on pressure in an empty cell and in the presence of polycarbonate (PC) and polydimethyl siloxane (PDMS).

DETAILED DESCRIPTION

The following description of the invention relates primarily to the use of deuterium nuclear magnetic resonance ($^2H$ NMR) spectroscopy in the evaluation of deuterium labeled analogues of glassy polymers. The structures of the polymers investigated are as follows:

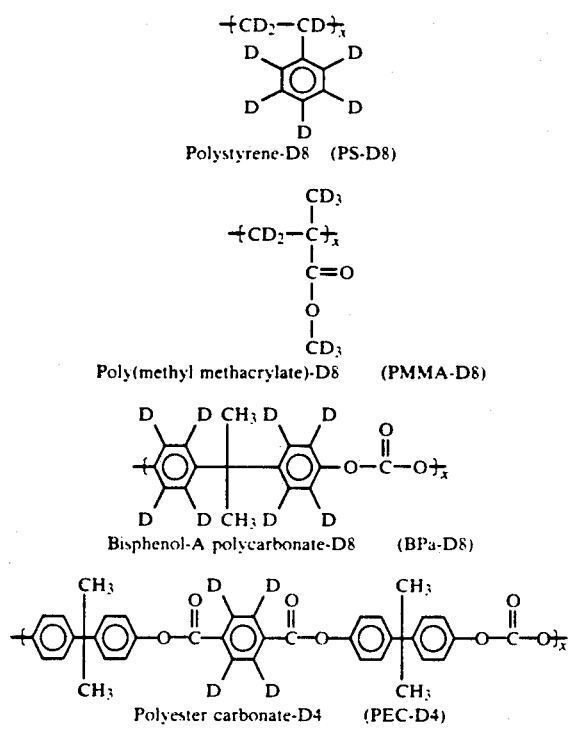

Polystyrene-D8 (PS-D8)

Poly(methyl methacrylate)-D8 (PMMA-D8)

Bisphenol-A polycarbonate-D8 (BPa-D8)

Polyester carbonate-D4 (PEC-D4)

The diffusion or plasticizing gas utilized preferably is $CO_2$ or any other gas whose molecules have NMR active nuclei, such as $^{13}C$, $^1H$, $^2H$, $^{29}Xe$, $^{19}F$, and $^{17}O$. However virtually any gas may be used.

Temperature and pressure variations are deemed to have the most effect on molecular dynamics. With these two parameters in mind, temperature dependence of the NMR spin lattice relaxation time ($T_1$) was first considered using a conventional form of $^2H$ NMR spectrometer provided with temperature controlling means. The spin lattice relaxation time probes molecular motions in the 30 MHz frequency regime. The variations are shown in the graph of FIG. 3 which plots $T_1$ in seconds versus a wide range of temperature variations in degrees centigrade.

Figure 3:
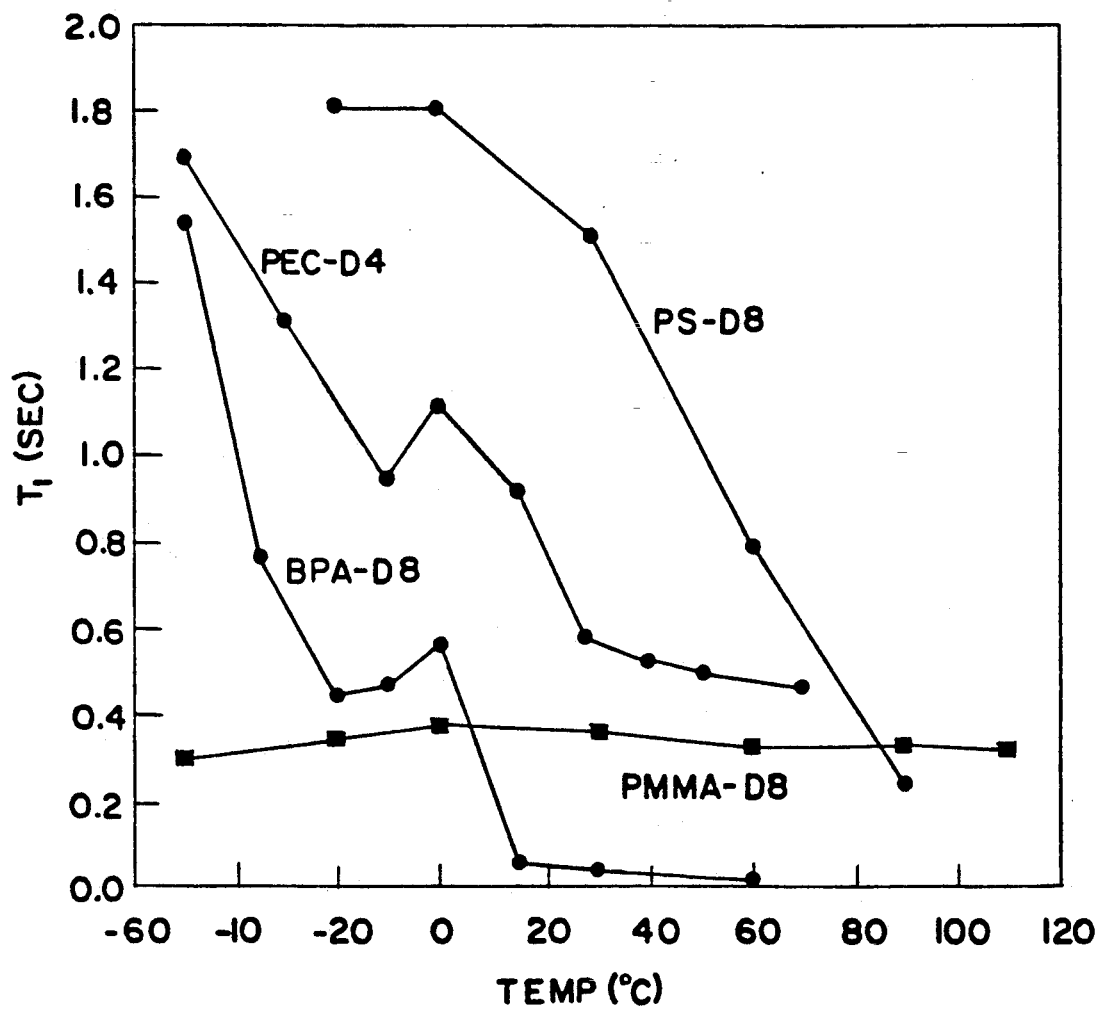
FIG. 3 is a graph comparing $^2H$ NMR spin lattice relaxation times with varying temperatures for selected polymers.

Referring to FIG. 3, the variation of $T_1$ values of PS-D8 in response to temperature change is difficult to explain because both backbone motions and phenyl motions are monitored due to the polymer's being completely deuterium labeled. However, the predominant motion in this temperature regime has been defined by others as restricted phenyl vibrational motions. Above 0° C., the $T_1$ value decreased dramatically to about 0.2 seconds at 90° C. Thus, in this temperature range, an increase in molecular dynamics causes a large decrease in $T_1$.

The polymer PMMA-D8 exhibits very little temperature dependence because motion of the methyls is monitored primarily. The backbone deuteriums contribute little to the $T_1$ measurement because their pattern is so broad. The motion of the methyl groups is fast at all temperatures and, therefore, is affected little by temperature variation.

Temperature dependence of the $T_1$ values for PEC-D4 and BPA-D8 go through a minimum at about −20° to 0° C. and then decrease sharply at still higher temperatures. Below 0° C., the rings undergo only rocking motions at the NMR sampling frequency, while at temperatures above 0° C. phenyl ring flips occur.

Temperature dependence of the line shapes of the subject polymers was also considered. FIG. 4 illustrates line shapes of PS-D8 at various temperatures within the range of from −20° to 90° C. Such line shapes exhibit very little change as a function of temperature for this particular polymer and, accordingly, line shape measurements are not definitive of temperature induced changes.

Similarly, the line shapes of the polymer PMMA-D8 shown in FIG. 5 recorded over a temperature range of from −50° to 90° C. do not indicate temperature induced molecular dynamics. Thus, it is apparent that line shape measurements are not particularly instructive concerning temperature dependence.

With the foregoing insight into temperature induced molecular dynamics, the apparatus of the subject invention illustrated in FIGS. 1 and 2 was designed to permit determination of the effects of pressure and dissolved gas on the molecular dynamics in solid materials, such as glassy polymers, as well as the molecular dynamics of the pressurizing gas. The apparatus comprises a high pressure sample cell 20 in the form of an elbow made from a ⅜ inch heavy wall glass, pressure rated to 700 psi. The cell includes two right angular portions 21 and 22. The portion 21 is adapted to be accommodated in a transverse bore 23 of a conventional wide line NMR probe insert 24.

The probe insert 24 may be tuned to the resonance frequency of $^2H$ so as to function primarily with deuterium labeled analogues of glassy polymers.

To the free end of the cell portion is connected semi-rigid tubing 25 which may be in the form of ⅛ inch copper tubing. The connection is made through a known type of Swagelok coupling 26, a similar coupling placing the upper end of the tubing 25 in communication with a flexible conduit 27 made from ⅛ inch polytetrafluoroethylene (PTFE) or copper tubing.

FIG. 2 illustrates the complete apparatus in partially assembled condition. The flexible conduit or tubing 27 is threaded through the bore 28 of a known type of magnet 29 mounted on a supporting stand 30. The cell and probe assembly 31 (FIG. 2) is received in the bore 28 of the magnet 29, with the tubing 27 projecting above the magnet 29. The probe assembly 31 is shielded to protect operators of the system from accidental cell explosion due to high pressure operation. If desired the center bore 28 of the magnet 29 also may be provided with a shield (not shown) to provide an additional safety factor.

That portion of the tubing 27 which extends upwardly beyond the magnet 29 is in communication with a pressure gauge 32. Beyond the gauge 32 the tubing 27 is connected to a manifold 33 provided with a series of valves 34–37.

The valve 34 controls communication between the NMR apparatus, specifically cell 20, and a vacuum pump 38, controlled by the valve 35, a vent line 39 controlled by the valve 37, and a pressurized gas cylinder 40 controlled by the valve 36. The manifold 33 and associated valves 34–37 constitute control means for establishing and maintaining variable pressure conditions.

The arrangement is such that the sample cell 20 may be evacuated, pressurized or vented with the gauge 32 providing information on cell pressure. For a given sample, it is unnecessary to remove the cell 20 from the probe 31 or the magnet 29 while varying the pressure within the cell.

As the construction and operation of NMR systems are well known, additional equipment normally associated therewith is not shown in FIGS. 1 and 2. For example, the magnet 29 will be provided with a suitable power source (not shown), and suitable temperature control means (not shown) are provided to establish a temperature controlled environment for the sample in the cell 20. Additionally, a suitable NMR recorder (not shown) is supplied to record spectra resulting from evaluation of sample materials.

Cells used in obtaining data represented in FIGS. 4-12 were pressure-tested to 1000 psig of $CO_2$ without failure. For purposes of maintaining an acceptable margin of safety, the recommended pressure limit for such cells is 500 psig. Estimated temperature limits of the probe 31 are $-10°$ to $60°$ C. However, advanced systems will allow extension of the pressure and temperature ranges.

Before data collection is initiated, each sample is exposed to a predetermined $CO_2$ pressure for 1 to 12 hours, depending upon sample thickness. For example, the samples listed hereinafter were in the form of fine, solid particles or powders. The samples were equilibrated for at least two hours after pressure changes and before the NMR measurement was initiated. Such exposure allowed each sample to reach a steady state concentration of dissolved gas, approaching equilibrium. Thus, a sample is preferably plasticized with the diffusion gas being used prior to the NMR measurement. Such plasticization may be carried out in the cell 20 using the pressurization system of FIG. 2.

Prior to pressurization, the portion 21 of the sample cell 20 is inserted in the bore 23 of the 2H NMR insert 24. The resulting assembly 31 is thereafter inserted in the bore 28 of the magnet 29 with the flexible tubing 27 extending above the magnet in communication with the valve 34 forming a part of the manifold 33.

The valves 34-37 may be operated to control pressure conditions within the cell 20. For example, to supply $CO_2$ under pressure, the valves 34 and 36 are opened until a desired pressure is indicated by the gauge 32. Both of the valves 34 and 36, or only the valve 34, then may be closed to maintain the desired pressure while operation of the NMR spectrometer is carried out.

Similarly, to evacuate the cell 20, the valves 34 and 35 may be opened and the vacuum pump 38 operated while the remaining valves 36 and 37 are closed. The valve 37 functions with the valve 34 to relieve pressure within the cell 20 through the vent 39.

$^2$H NMR spectra were obtained using the known quadrupole echo pulse technique. In the particular evaluations referred to hereinafter, a Bruker CXP-200 spectrometer was used to obtain 30.7 MHz $^2$H NMR spectra. The 90° pulse width was 6 microseconds. The delay time was 5.0 sec., the data acquisition size was 4K, the accumulation time was 0.001 sec., the sweep width was 1.00 MHz, the apodisation was exponential with 2 KHz line broadening, and the delay time between 90° pulses was approximately 40 milliseconds. Acquisition of data was begun at the top of the echo. A pressure range of from vacuo to 35 atmospheres was selected, although an acceptable pressure range may be 0 to 50 atmospheres.

As a part of the evaluation of the specific polymers identified herein, line shapes of such polymers were recorded at varying pressures. FIGS. 6 and 7 illustrate the line shapes obtained with respect to the two evaluated polymers of FIGS. 4 and 5, namely, PS-D8 and PMMA-D8, respectively.

FIG. 6 illustrates line shapes of PS-D8 at various pressures commencing with vacuo and terminating at 35 atmospheres. Such line shapes exhibit very little change as a function of the $CO_2$ pressure for this particular polymer and, as will become apparent, indicate that line shape measurements are not particularly definitive of pressure induced changes.

Similarly, the line shapes of the polymer PMMA-D8 shown in FIG. 7 at three different pressures, namely, vacuo, 10.5 atmospheres, and 21 atmospheres, do not indicate pressure induced molecular dynamics. While it subsequently will become apparent that the molecular dynamics of PMMA-D8 are basically not pressure dependent, it has been established that those of PS-D8 are pressure dependent. Thus, as in the case of temperature dependence it is concluded that line shape measurements are not particularly instructive concerning pressure dependence.

Pressure dependence of molecular dynamics in solid materials can best be evaluated on the basis of the NMR spin lattice relaxation time, $T_1$. For example, FIG. 8 illustrates the effect of pressure variation, at 27° C., on $T_1$ with respect to PS-D8, PEC-D4, and PMMA-D8. As previously mentioned, PMMA-D8 shows no pressure dependence. This is consistent with lack of temperature dependence (FIG. 3).

Based on the data set forth in FIG. 8, only PS-D8 shows a marked correlation of $T_1$ with the $CO_2$ pressure. Consistent with FIG. 3, the $T_1$ value of PS-D8 approaches its largest value in FIG. 8 at 27° C. However, while the temperature remains constant at 27° C., an increase in pressure causes the $T_1$ value to decrease from the value of 1.4 sec. in vacuo to a value of about 0.7 sec. at 35 atmospheres. The largest change is observed between vacuo and about 7 atmospheres of $CO_2$ pressure. Above 7 atmospheres pressure, the decrease in $T_1$ is much less pronounced.

PEC-D4 shows basically no pressure dependence because, at 27° C., the $T_1$ value is already at a minimum (FIG. 3) and any increases in motion do not have a measureable effect on such value. While not plotted in FIG. 8, BPA-D8 also exhibits virtually no pressure dependence at 27° C.

With both PEC-D4 and BPA-D8 showing little or no pressure dependence variation in $T_1$ values at 27° C. the pressure dependence of these polymers was evaluated at 0° C. so that any increase in molecular dynamics could be more readily observed. FIG. 9 illustrates the evaluation results for PEC-D4 and BPA-D8 at 0° C. with a plot of PS-D8 at 27° C. being included for comparison.

It was observed that the $T_1$ values for PEC-D4 and BPA-D8 decreased to some extent with an increase in pressure, the decrease of $T_1$ values for PEC-D4 appearing to be almost linear while BPA-D8 exhibited a behavior similar to that of PS-D8. Thus, molecular motions of PS-D8, PEC-D4, and BPA-D8 are enhanced by $CO_2$ pressure variations.

As mentioned above, changes induced in polymers by variations in the $CO_2$ pressure are much easier to observe by $^2$H NMR $T_1$ measurements than by line shape measurements. The 2H NMR line shapes are less sensitive to vibrational motions as compared to site jumps or continuous rotational motion. $T_1$ measurements are equally sensitive to vibrational and rotational motions. Since the molecular motions being monitored for these polymers in this temperature regime are primarily vibrational in character, $T_1$ measurements are more sensitive and definitive.

It is not unreasonable to conclude from the adduced data that the diffusivity of a diffusion gas, such as $CO_2$, is enhanced by pressure induced molecular dynamics of a polymer. Relying on known data concerning diffusivity, the $^2H$ NMR $T_1$ values obtained from the evaluations described above were correlated with diffusivity values of $CO_2$ in PS-D8 as shown in FIG. 10. Corresponding correlations were done with respect to BPA-D8 as illustrated in FIG. 11.

In considering the comparative information contained in FIGS. 10 and 11, the question arises as to whether diffusivity of $CO_2$ is actually enhanced by molecular dynamics and, thus, whether the diffusivity and molecular motion are mutually dependent, or whether they are dependent on the same parameters and mutually independent.

There are two possible explanations for the apparent correlation between the macroscopic diffusivity of $CO_2$ in PS-D8 and BPA-D8 and their microscopic molecular dynamics as determined by $^2H$ NMR spectroscopy. First, diffusion is aided by the microscopic dynamic processes such as phenyl ring flips and oscillatory motions. As these molecular processes occur, they facilitate diffusion of the penetrant in the polymer matrix.

The second possible explanation for the correlation is that the presence of the dissolved gas molecule causes plasticization of the polymer giving rise to increased molecular dynamics and gas diffusivity. Thus, the two processes (molecular dynamics and diffusivity) are both a function of the plasticization of the polymer by the sorption of the gas, but are mutually independent. Stated differently, while transport rate and diffusivity are dependent on a common parameter (pressure variation), they are mutually independent. This explanation is considered viable because the relative frequencies of diffusivity and the NMR dynamics measurements are so different. Therefore, the molecular processes observed by NMR may be too slow to affect the diffusivity of the gas.

Either explanation would lead to the conclusion that the presence of the gas in the polymer does alter its molecular dynamics and such molecular dynamics are pressure dependent.

The evaluation described is focused on monitoring molecular level dynamics of the polymer and correlating them with transport behavior. The results, although aimed at transport, provide an understanding of the changes which occur during plasticization of a polymer. The concepts developed are also of interest in evaluating plasticization effects on mechanical properties of commercial materials.

For example, the procedure may be relied upon to determine pressure dependence of reactions as well as molecular dynamics. Further, the procedure appears to be capable of defining the effect of gas molecules absorbed on surfaces (catalysts). Still further, the procedure appears to be viable in the analysis of air sensitive compounds in a controlled environment. The environment of adsorbed or dissolved gas molecules may also be determined using the NMR of other nuclei. For example, the procedure has been used to study the pressure dependent molecular dynamics of $CO_2$ dissolved in polycarbonate by high resolution 13C NMR. Other appropriate diffusion gases including $H_2$, $D_2$, $CD_4$, $H_2S$, $^{29}Xe$, CO, and HF, may be used.

The disclosed apparatus also may be used to determine the molecular dynamics of the sorbed gas in an analogous manner. FIG. 12 illustrates $^2H$ NMR $T_1$ measurement of $CD_4$ as a function of pressure in an empty cell, as well as measurements in which the cell contains polycarbonate (PC) and polydimethyl siloxane (PDMS), respectively. Hence, the term "material" as used in the claims shall mean either a solid or a gas sorbed by the solid unless the context requires otherwise.

The method and apparatus of the invention provide numerous advantages over known evaluation procedures. For example, much higher gas pressures may be used when practicing the invention than can be used in existing MAS techniques. In addition, the invention enables continuously variable pressure operation to be obtained using a simple pressure control system. Furthermore, no pressurized sample handling is required, thereby improving safety characteristics.

In addition to the foregoing, variable temperature operation is obtainable. Moreover, simple and rapid pressure change is possible. Finally, excellent definition of dynamic and structural characteristics of the material being evaluated is obtainable.

What is claimed is:

1. Apparatus for use in determining pressure induced microscopic molecular dynamics in a material, said apparatus comprising:
    (a) a cell for accommodating therein a sample of said material;
    (b) means for obtaining NMR spectra of the material accommodated in said cell;
    (c) manifold means;
    (d) conduit means in communication with said cell and said manifold means;
    (e) a pressurized fluid source in communication with said manifold means; and
    (f) control means for placing said cell in communication with said fluid source,
    (g) said cell comprising an elbow having two arms, one of said arms being adapted for accommodation in an NMR probe, and being in communication with said conduit means.

2. A method of determining molecular dynamics in a material, said method comprising:
    (a) enclosing a sample of said material in a pressure containment cell;
    (b) introducing a fluid under pressure into said cell;
    (c) subjecting said cell to a magnetic field of such intensity as to produce NMR spectra;
    (d) varying said pressure; and
    (e) collecting and correlating resultant NMR spectra.

3. The method of claim 2 including varying the temperature of said sample during the collection of said spectra.

4. The method of claim 2 including varying said pressure between about 0 and 50 atmospheres.

5. The method of claim 2 wherein said fluid is selected from the group of gas molecules having NMR active nuclei consisting essentially of $13_C$, $^1H$, $^2H$, $^{29}Xe$, $^{19}F$, and $^{17}O$.

6. The method of claim 2 wherein said material comprises a solid polymer in particulate form and wherein the NMR data are obtained on said polymer.

7. The method of claim 2 wherein said material is gas sorbed by said sample and the NMR data are obtained on said sorbed gas.

8. The method of claim 2 wherein said sample is plasticized with said fluid prior to the collection of said NMR spectra.

9. A method of determining molecular dynamics in a material, said method comprising:
 (a) enclosing a sample of said material in a pressure containment cell;
 (b) inserting said cell in an NMR probe;
 (c) introducing a fluid under pressure into said cell;
 (d) subjecting said probe to a magnetic field of such intensity as to produce NMR spectra;
 (e) varying said pressure; and
 (f) collecting and correlating resultant NMR spectra.

10. The method of claim 9 wherein said material is a solid polymer in particulate form and wherein the NMR data are obtained on said polymer.

11. The method of claim 9 wherein said material is gas sorbed by said sample and the NMR data are obtained on said sorbed gas.

12. The method of claim 9 wherein said probe contains deuterium nuclei.

13. The apparatus of claim 1 including pressure gauge means in communication with said cell.

14. The apparatus of claim 1 including shield means encircling said cell.

15. The apparatus of claim 1 including pressure gauge means in communication with said cell.

16. The apparatus of claim 1 wherein the pressure of said fluid source is variable.

17. The apparatus of claim 1 wherein said fluid source communicates with said conduit means externally of said bore.

18. The apparatus according to claim 1 wherein said fluid comprises a gas.

19. The apparatus of claim 1 including a vacuum source in communication with said manifold means, said control means being operable to place said cell in communication with said vacuum source.

* * * * *